(12) United States Patent
Chung

(10) Patent No.: US 8,126,413 B2
(45) Date of Patent: Feb. 28, 2012

(54) VEHICLE ANTENNA

(75) Inventor: Tae Inn Chung, Pohang-si (KR)

(73) Assignee: Hyundai Motor Company, Seoul (KR)

( * ) Notice: Subject to any disclaimer, the term of this patent is extended or adjusted under 35 U.S.C. 154(b) by 556 days.

(21) Appl. No.: 12/326,345

(22) Filed: Dec. 2, 2008

(65) Prior Publication Data

US 2009/0247104 A1    Oct. 1, 2009

(30) Foreign Application Priority Data

Mar. 31, 2008    (KR) .................. 10-2008-0029787

(51) Int. Cl.
*H04B 1/06*    (2006.01)
*H04B 7/00*    (2006.01)

(52) U.S. Cl. ................................... 455/232.1

(58) Field of Classification Search ............. 455/232.1
See application file for complete search history.

(56) References Cited

U.S. PATENT DOCUMENTS 5,793,309 A * 8/1998 Nellson ............... 340/932.2
7,365,605 B1 * 4/2008 Hoover .................. 330/301

FOREIGN PATENT DOCUMENTS

| JP | 2006-332770 | 12/2006 |
| KR | 10-2003-0070234 | 8/2003 |
| KR | 10-2005-0008019 | 1/2005 |
| KR | 10-0726410 | 6/2007 |
| KR | 10-2008-0015286 | 2/2008 |

* cited by examiner

*Primary Examiner* — Lincoln Donovan
*Assistant Examiner* — Daniel Rojas
(74) *Attorney, Agent, or Firm* — Edwards Wildman Palmer LLP; Peter F. Corless

(57) ABSTRACT

A vehicle antenna includes a first Automatic Gain Control (AGC) unit and a second AGC unit. The first AGC unit may attenuate an input signal based on the strength of the input signal, and then output the attenuated signal to a transistor. The second AGC unit may control a power to be supplied or not to the transistor using a switching function based on the strength of the input signal. With the antenna, the signals of a strong electric field as well as the signals of a weak electric field adjacent to the strong electric field can be effectively controlled.

12 Claims, 7 Drawing Sheets

[FIG. 1]
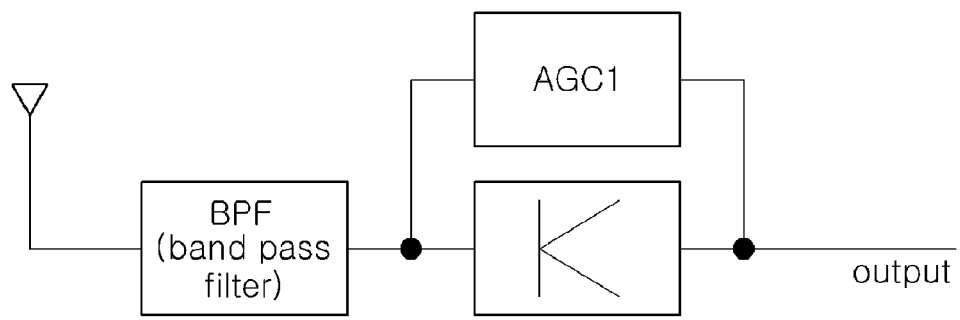

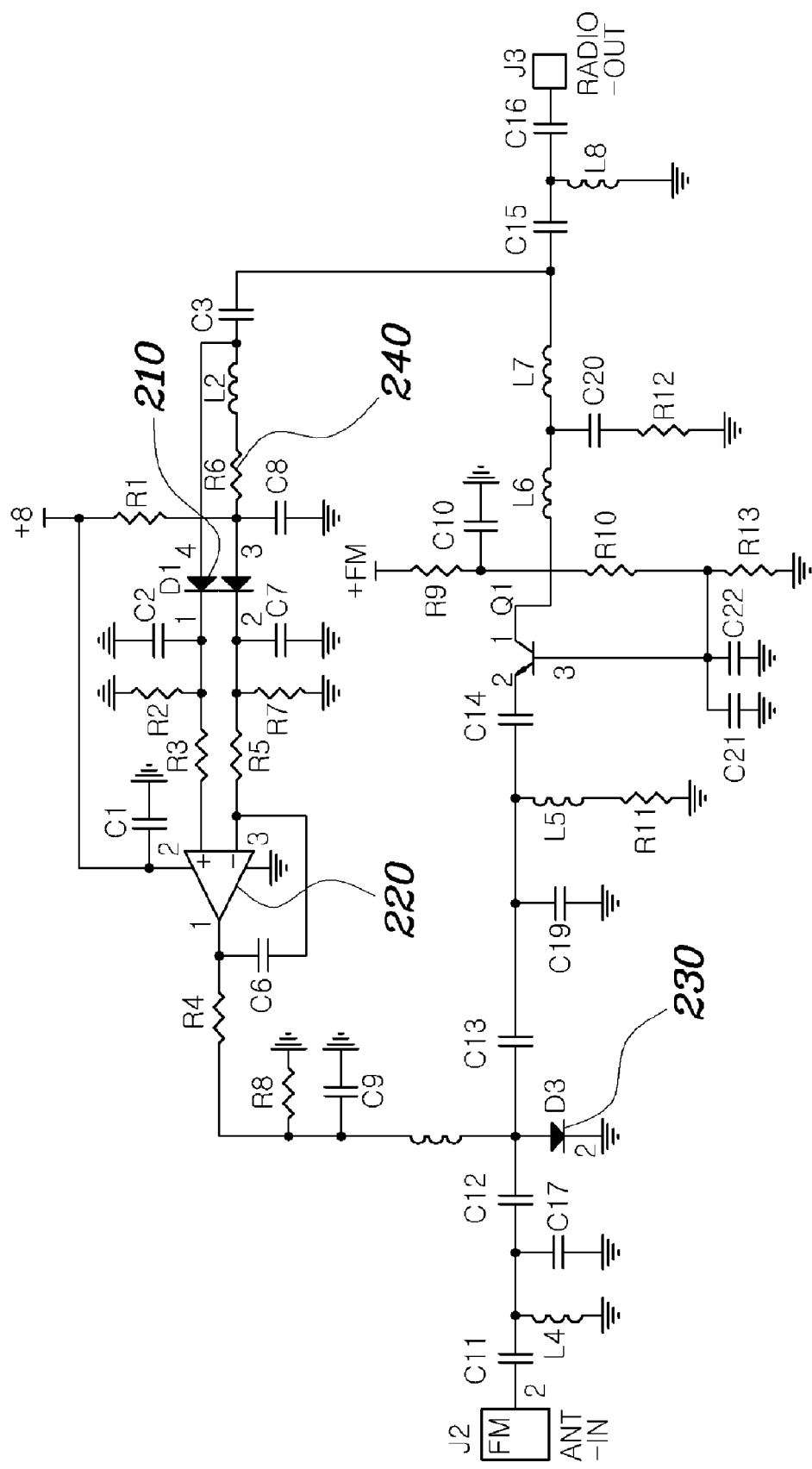
[FIG. 2]

[FIG. 3]
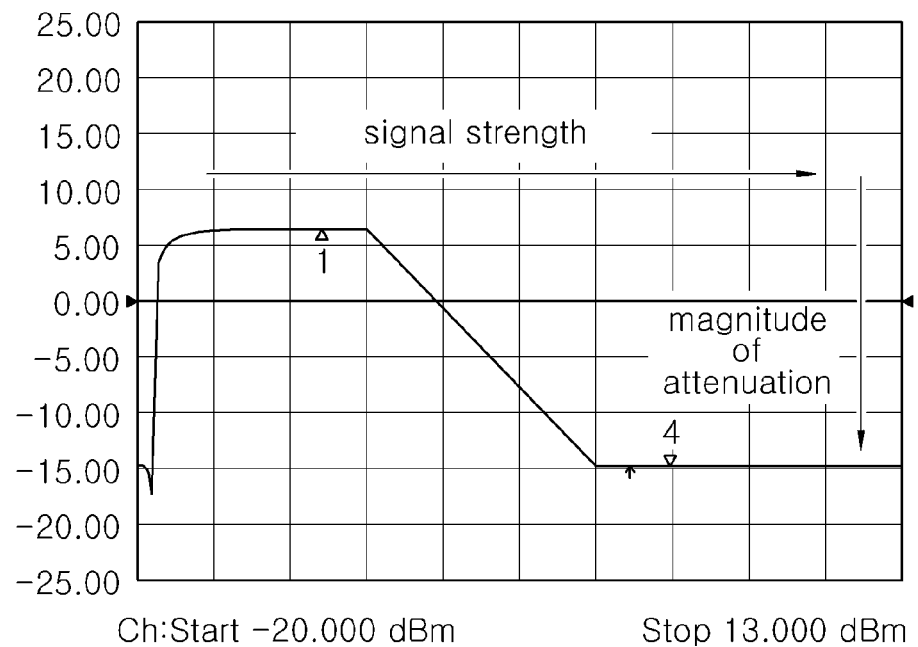
[FIG. 4]
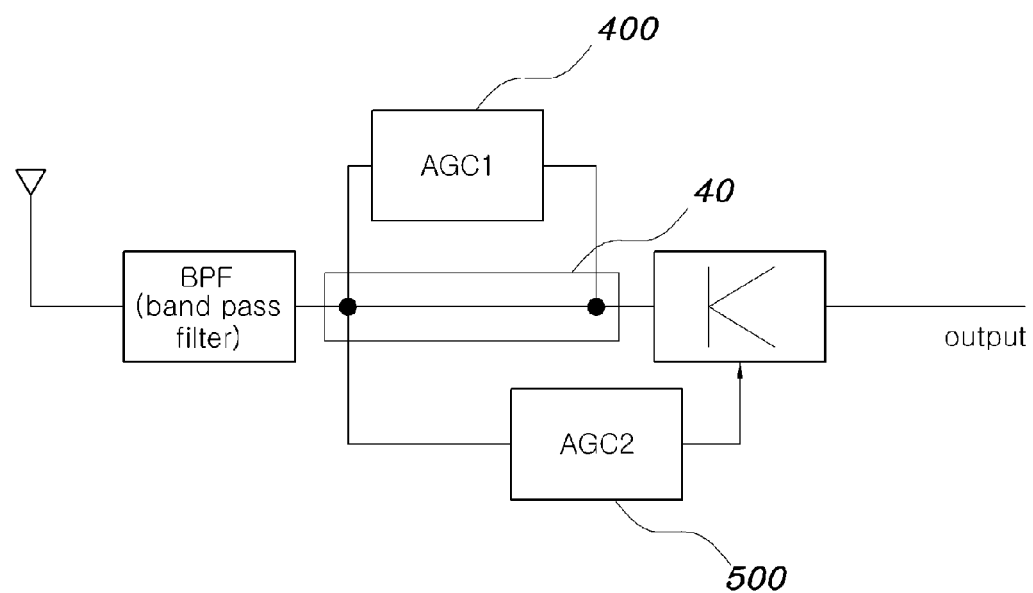

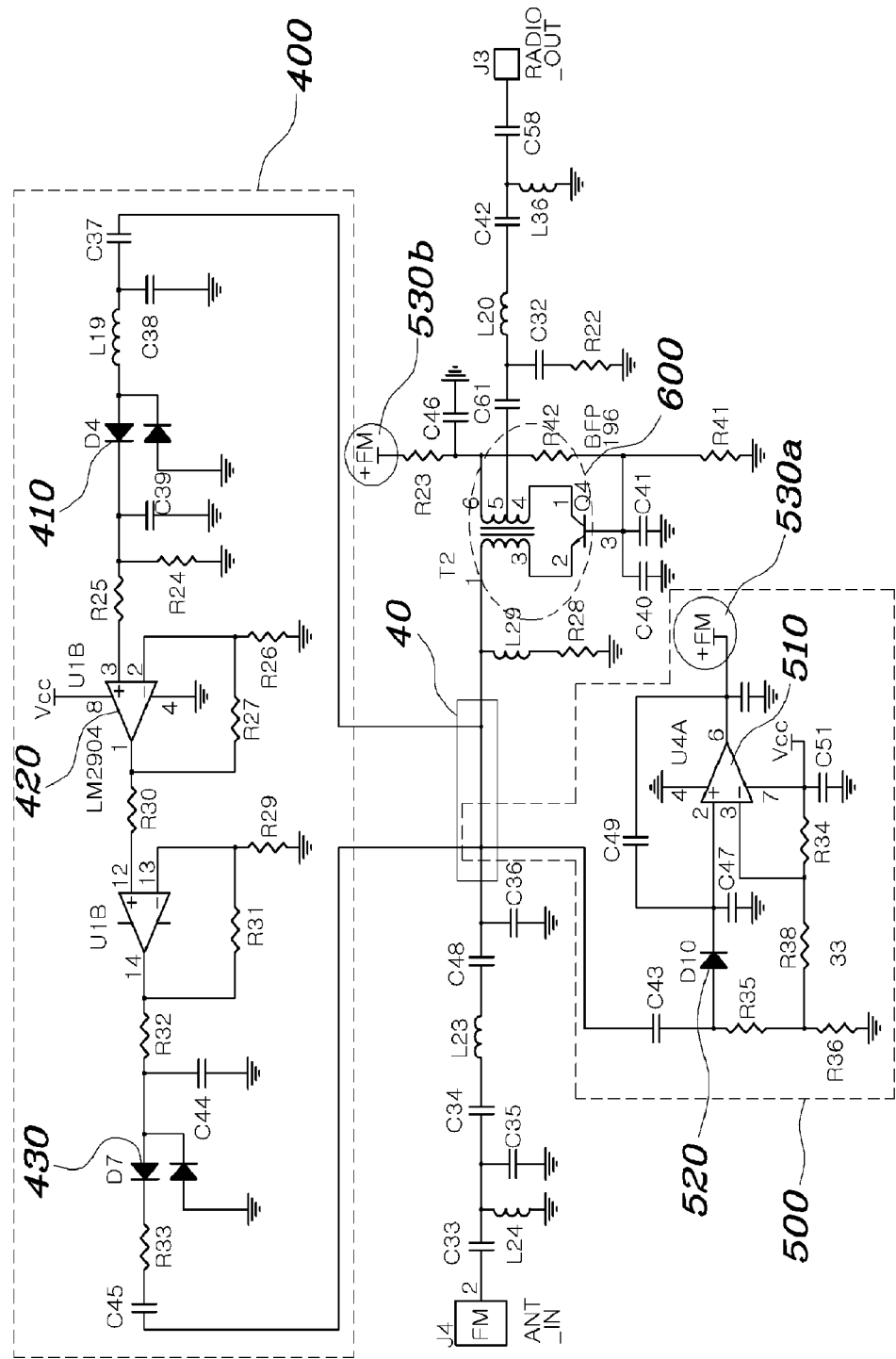
[FIG. 5]

[FIG. 6]
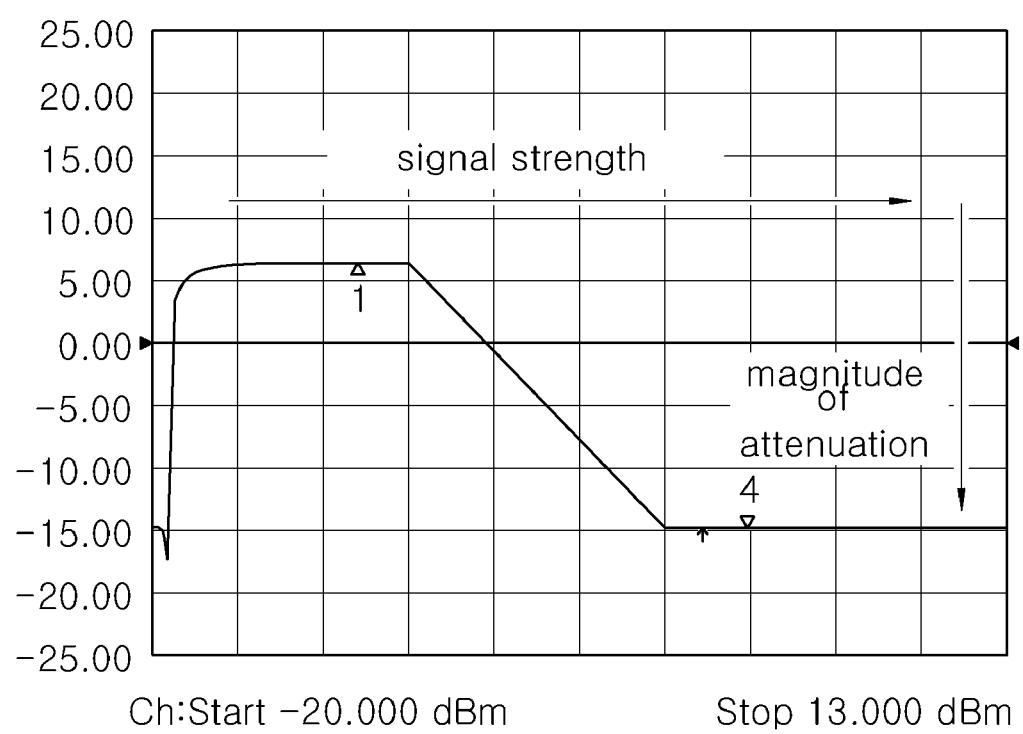

[FIG. 7]
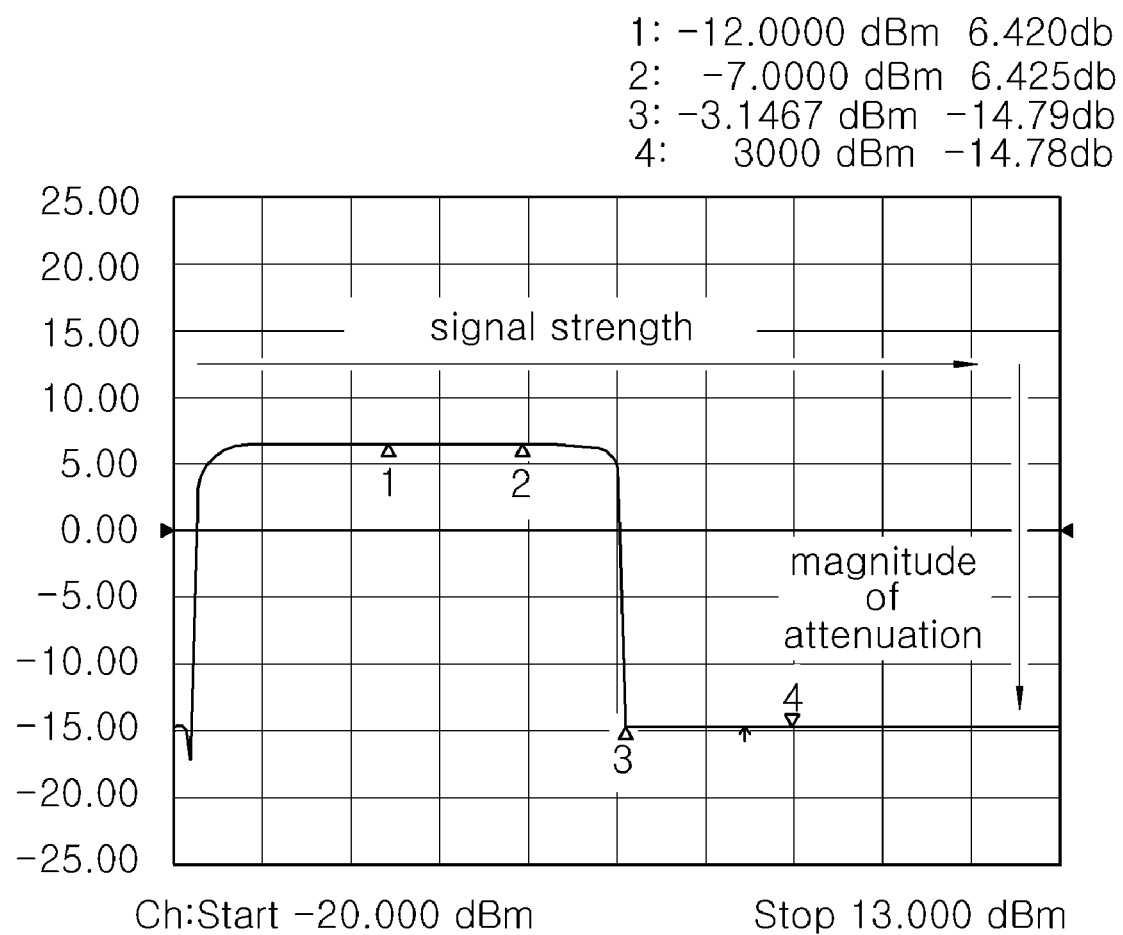

[FIG. 8]
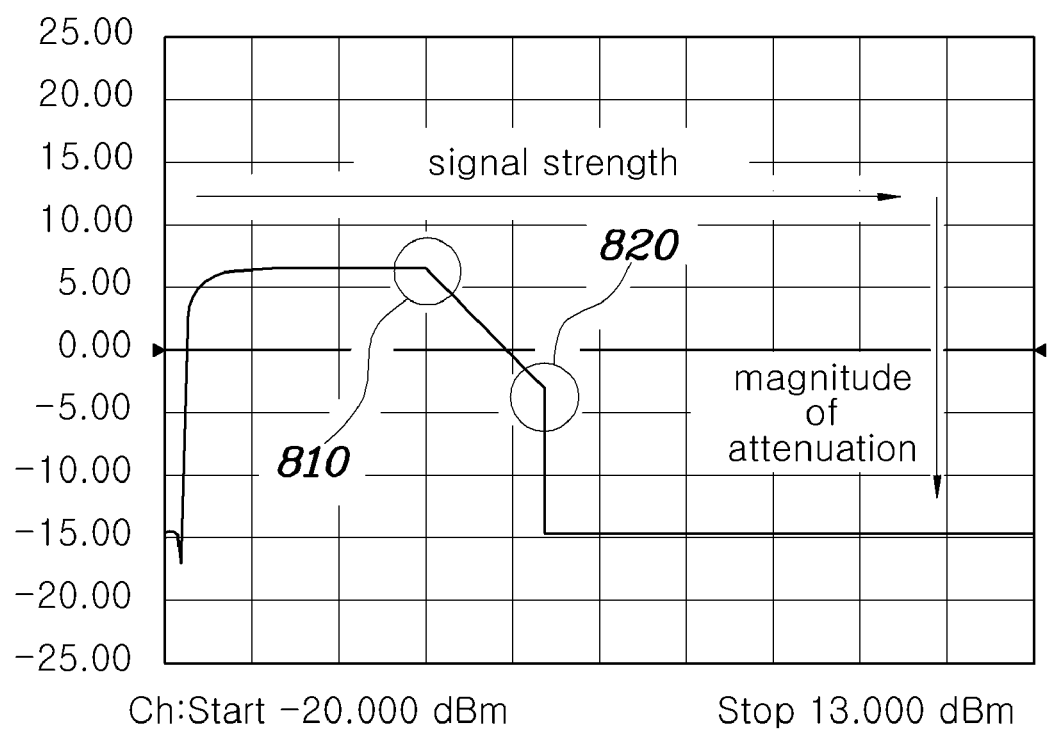

VEHICLE ANTENNA

CROSS-REFERENCE TO RELATED APPLICATIONS

This application claims under 35 U.S.C. §119(a) priority to Korean Application No. 10-2008-0029787, filed on Mar. 31, 2008, the disclosure of which is incorporated herein by reference in its entirety.

BACKGROUND

1. Technical Field

The present invention relates generally to a vehicle antenna, and, more particularly, to a vehicle antenna in which Automatic Gain Control (AGC) function is improved, thereby effectively controlling signals in strong electric field area as well as the signals in a weak electric field area adjacent to the strong electric field area.

2. Related Art

With the development of technologies, the desire for entertainment using high-technology information and visual media has increased. To meet the desire, vehicle makers have applied Audio/Video (A/V) systems to vehicles. One of the important requirements of the A/V systems for vehicles is high performance and ease of installation.

Vehicle antennas developed to date include a hand-operated or automatic antenna for receiving radio signals, which has a length of around 70 cm and is mounted on a portion of the front or rear fender of a vehicle and a Television (TV) antenna combined with a radio antenna using a hot-wire structure on the rear windshield of a vehicle.

FIG. 1 is a block diagram of a conventional antenna amplifier module.

The conventional antenna amplifier module includes a slope type AGC unit (ACCL) for controlling weak electric field signals close to a strong electric field. The slope-type AGC unit is configured to have a feedback loop in such a way that a signal is detected at an amplifier output stage and then the strength of a signal to be input to an input stage is adjusted based on the strength of the signal at the amplifier output stage. The slope-type AGC unit transmits voltage, output through a detection diode and a comparator, to a Positive-Intrinsic-Negative (PIN) diode based on the strength of the output signal, so that the attenuation of the PIN diode occurs in the range of predetermined magnitudes (for example, an arbitrary value in the range from 0 dB to 10 dB based on the magnitude of the voltage, thereby controlling the signals of a weak electric field adjacent to a strong electric field.

FIG. 2 is a circuit diagram showing the AGC unit of the conventional amplifier module.

The slope-type AGC unit includes a diode 210 for detecting an input signal, and a comparator 220 for comparing an input signal level with a preset signal level. For example, the comparator may be an Operational Amplifier (OPAMP: LM2904).

The operational principle of the slope-type AGC unit will be described in brief.

When an input signal which exceeds a threshold range is input, a PIN diode 230, added to a Transistor (TR) input stage, compulsorily attenuates the input signal so that only a signal having a desired level can be input.

A Frequency Modulated (FM) output signal passes through a Schottky Diode 210 which is configured to perform rectification into a Direct Current (DC) level, and then enters a Schmidt trigger comparator 220 which is configured using an LM2904 OPAMP. The comparator 220 compares the DC level of the signal with a reference DC value which will be used as threshold voltage, and then outputs an output signal.

Since a problem may occur in that an output value continuously varies at the level near noise and threshold, the comparator is configured using a Schmidt trigger having positive feedback. The Schmidt trigger comparator can adjust reference voltage which will be used as threshold voltage by adjusting a resistor 240.

FIG. 3 is a graph showing the AGC operational characteristics of the above-described AGC unit.

When the strength of an output signal increases, voltage over the PIN diode 230 of FIG. 2 increases. Therefore, the attenuation of the PIN diode increases, so that a slope-type operational characteristic appears. The slope type, in which attenuation gradually occurs when a level which is equal to or higher than a predetermined signal enters in the form of feedback of the output signal, is an AGC type which is suitable for controlling the signals of a weak electric field adjacent to a strong electric field.

However, since the strength of a signal is determined at an amplifier output stage, the conventional AGC circuit has problems in that the operation of an AGC unit may be affected by noise depending on an amplifier amplification degree, in that it is not suitable for controlling strong electric field signals, and in that amplification output which exceeds the P1 dB of a TR may occur when a signal, the degree of which is equal to or higher than the amplifier amplification degree, is input.

The above information disclosed in this Background section is only for enhancement of understanding of the background of the invention and therefore it may contain information that does not form the prior art that is already known in this country to a person of ordinary skill in the art.

SUMMARY

One of the objects of the present invention is to provide a vehicle antenna, in which AGC function of the amplifier module is improved, thereby effectively controlling strong electric field signals as well as the signals of a weak electric field adjacent to a strong electric field.

One aspect of the present invention provides a vehicle antenna including a first Automatic Gain Control (AGC) unit and a second AGC unit. The first AGC unit may attenuate an input signal based on the strength of the input signal, and then output the attenuated signal to a transistor. The second AGC unit may control a power to be supplied or not to the transistor using a switching function based on the strength of the input signal. In this case, the input signal of the first AGC unit and the second AGC unit is a input stage signal of the transistor without passing through the transistor.

Preferably, if the strength of the input signal is equal to or greater than a first reference value, the first AGC unit operates such that the strength of the input signal is gradually attenuated. And if the strength of the input signal is equal to or greater than a second reference value, the second AGC unit operates together with the first AGC unit such that the strength of the input signal is attenuated at a time.

Preferably, the first AGC unit may include an Operational Amplifier (OPAMP) which is used as an amplifier such that if the strength of the input signal, which is equal to or greater than the first reference value, increases, gain of the OPAMP increases, high voltage is output, and thereby the attenuation increases.

Suitably, the second AGC unit may include an OPAMP which is used as a switching-type comparator such that if the strength of the input signal is lower than the second reference value, the power is supplied to the transistor by being switched on and the transistor performs an amplification function, and if not, the power is not supplied to the transistor by being switched off and the transistor performs an attenuation function.

Preferably, the transistor may be coupled to a transformer.

Preferably, the first AGC unit may further comprise a Positive-Intrinsic-Negative (PIN) diode for attenuating the input signal which is equal to or greater than the first reference value so that only a signal at a predetermined level is input.

Preferably, the second AGC unit may further comprise a coupled capacitor, a Schottky Diode and a switching-type Schmidt trigger comparator. The Schottky Diode may rectify the signal output from the coupled capacitor into a Direct Current (DC) level.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The above and other features of the invention are discussed infra.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a block diagram of a conventional antenna amplifier module;

FIG. 2 is a diagram showing the AGC circuit of the conventional antenna amplifier module;

FIG. 3 is a graph showing the operational characteristics of the AGC unit of FIG. 2.

FIG. 4 is a block diagram showing an antenna amplifier module according to an embodiment of the present invention;

FIG. 5 is a diagram showing the AGC circuit of the antenna amplifier module according to the embodiment of the present invention;

FIG. 6 is a graph showing the operational characteristics of AGC 1 of the antenna amplifier module according to the embodiment of the present invention;

FIG. 7 is a graph showing the operational characteristics of AGC 2 of the antenna amplifier module according to the embodiment of the present invention; and FIG. 8 is a graph showing final output characteristics of the antenna amplifier module according to the embodiment of the present invention;

DETAILED DESCRIPTION

Reference now should be made to the drawings, in which the same reference numerals are used throughout the different drawings to designate the same or similar components.

FIG. 4 is a block diagram showing an antenna amplifier module according to an embodiment of the present invention.

The antenna amplifier module includes AGC 1 400 and AGC 2 500. The AGC 1 400 and the AGC 2 500 are configured in the form of a circuit that can determine the strength of an input signal from an amplifier input stage 40.

According to the present invention, if the strength of the input signal exceeds a first reference value, then the AGC 1 400 performs attenuation to the input signal which is not passed through a transistor. And the AGC 2 500, which is added for controlling strong electric field signals, is configured in the form of a switching circuit that can control a power of the transistor when the input signal has a strength which is equal to or greater than a second reference value that is greater than the first reference value.

That is, the AGC 1 400 operates to attenuate an input signal when the input signal has a strength being or exceeding the first reference value, and the AGC 2 500 operates together with the AGC 1 400 when the input signal has a strength being or exceeding the second reference value. The input signal of the AGC 1 400 and the AGC 2 500 is an input stage 40 signal of an amplifier including the transistor without passing through the transistor.

FIG. 5 is a diagram of the AGC circuit of the antenna amplifier module according to the embodiment of the present invention. In FIG. 5, reference numeral 400 indicates a circuit of the AGC 1, and reference numeral 500 indicates a circuit of the AGC 2.

In the AGC 1 400, a PIN diode 430 is added to the output stage of the AGC 1 400, that is, the input stage of the amplifier. Accordingly, when an input signal has a strength that is or exceeds a first reference value, the input signal is forcibly attenuated, thereby ensuring that only signals having a predetermined level can be input to the TR 600. The following table 1 shows the measurement results of the degree of attenuation according to voltage over the PIN diode 430.

TABLE 1

| AGC voltage output | Attenuation of PIN diode |
|---|---|
| 0 V | 0 dB |
| 0.5 V | −5 dB |
| 0.7 V | −10 dB |
| 0.8 V | −20 dB |

An FM output signal is input to the AGC 1 400 through the amplifier input stage 40, passes through a Schottky diode 410 for rectifying the input signal output through a coupled capacitor into a DC signal, and then enters an LM 2904 OPAMP 420.

While the OPAMP is used as a comparator in the above-described conventional antenna amplifier module, it is used as an amplifier itself in the present invention. Accordingly, as the gain of the operational amplifier 420 increases in proportion to an increase in the level of the input signal, the output voltage thereof increases. The increase of the output voltage increases the attenuation of the PIN diode 430, thereby attenuating the signal to be input to the transistor 600. As a result, a slope in which the attenuation by the PIN diode 430 increases as the gain of the operational amplifier 420, that is, the voltage value, gradually increases is achieved. The operational amplifier 420 can be constructed using a two-stage operational amplifier. This serves to achieve a stable output gain.

The AGC 2 500 controls input voltage to a transistor 600 using an OPAMP having a hysteresis function when a signal having a strength equal to or greater than a second reference value (for example, two times the strength of an AGC signal) is input. Unlike the conventional system, the system according to the present invention performs switching on/off power 530a and 530b to be input to a transistor 600 coupled to a transformer by using the Schmidt trigger comparator 510 configured to include a switching-type IS3140 OPAMP and without using a PIN diode (attenuator). That is, when an input signal which is equal to or greater than the second reference value is input to the amplifier input stage, the power to be supplied to the transistor 600 is controlled such that the input signal is coupled to the transformer and the transistor 600 and then is output.

When strength of a signal input to the comparator 510 is lower than the second reference value, power input to the transistor 600 is switched on, resulting that a high voltage (12 V) always flows as the output of the comparator 510 and is applied as transistor input power. In contrast, if the strength of the input signal is equal to or greater than the second reference value, the power input to the transistor 600 is switched off, with the result that a low voltage (0 V) flows as the output of the comparator 510 and is applied as transistor input power, so that the transistor 600 functions not as an amplifier but as an attenuator.

FIG. 6 and FIG. 7 are graphs showing the operational characteristics of the AGC 1 and AGC 2, respectively, of the antenna amplifier module according to the embodiment of the present invention. FIG. 8 is a graph showing final output characteristics of the antenna amplifier module according to the embodiment of the present invention.

With reference to the operational characteristic graph of FIG. 6, the operational characteristics are the same as in the above-described related art even though circuits are different from each other. When the strength of the output signal of the amplifier input stage 40 increases, voltage over the PIN diode 430 of the AGC 1 400 increases, thereby increasing the attenuation of the PIN diode 430.

As a result, a slope-type operational characteristic is realized. The slope type, in which attenuation gradually occurs when a signal having strength equal to or greater than a first reference value inputs, is an AGC type which is suitable for controlling the signals of a weak electric field adjacent to a strong electric field.

As shown in FIG. 7, when a signal having a strength equal to or greater than a second reference value is input, the transistor coupled to the transformer functions as an attenuator due to a switching-type comparator which causes the input signal to be attenuated. This characteristic is suitable for controlling strong electric field signals.

FIG. 8 is a graph showing an operating characteristic of the antenna amplifier module comprising the AGC 1 410 and AGC 2 420 in a hybrid form. As shown in FIG. 8, both gradual attenuation and sharp attenuation can be realized. That is, the AGC 1 400 operates in a portion indicated by reference numeral 810 in case an input signal has a strength equal to or greater than a first reference value, and the AGC 2 500 operates from a portion indicated by reference numeral 820 in case the input signal has a strength equal to or greater than a second reference value. With the antenna amplifier module, both strong electric field signals and weak electric field signals adjacent to the strong electric field can be controlled.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A vehicle antenna, comprising:
   a first Automatic Gain Control (AGC) unit that attenuates an input signal based on strength of the input signal, and then outputs the attenuated signal to a transistor; and
   a second AGC unit that controls a power to be supplied or not to the transistor using a switching function based on the strength of the input signal, wherein, the second AGC unit includes a coupled capacitor, a Schottky Diode and a switching-type Schmidt trigger comparator, and
   wherein the input signal of the first AGC unit and the second AGC unit is an input stage signal of the transistor without passing through the transistor.

2. The vehicle antenna as set forth in claim 1, wherein, if the strength of the input signal is equal to or greater than a first reference value, the first AGC unit operates such that the strength of the input signal is gradually attenuated, and if the strength of the input signal is equal to or greater than a second reference value, the second AGC unit operates together with the first AGC unit such that the strength of the input signal is attenuated at a time, the second reference value being greater than the first reference value.

3. The vehicle antenna as set forth in claim 2, wherein the first AGC unit includes an Operational Amplifier (OPAMP) which is used as an amplifier such that if the strength of the input signal, which is equal to or greater than the first reference value, increases, gain of the OPAMP increases, high voltage is output, and thereby the attenuation increases.

4. The vehicle antenna as set forth in claim 2, wherein the second AGC unit includes an OPAMP which is used as a switching-type comparator such that if the strength of the input signal is lower than the second reference value, the power is supplied to the transistor by being switched on and the transistor performs an amplification function, and if not, the power is not supplied to the transistor by being switched off and the transistor performs an attenuation function.

5. The vehicle antenna as set forth in claim 1, wherein the transistor is coupled to a transformer.

6. The vehicle antenna as set forth in claim 1, wherein the first AGC unit comprises a Positive-Intrinsic-Negative (PIN) diode.

7. A vehicle antenna, comprising:
   a first Automatic Gain Control (AGC) unit that attenuates an input signal based on strength of the input signal, and then outputs the attenuated signal to a transistor; and
   a second AGC unit that controls a power to be supplied or not to the transistor using a switching function based on the strength of the input signal,
   wherein the input signal of the first AGC unit and the second AGC unit is an input stage signal of the transistor without passing through the transistor and if the strength of the input signal is equal to or greater than a first reference value, the first AGC unit operates such that the strength of the input signal is gradually attenuated, and if the strength of the input signal is equal to or greater than a second reference value, the second AGC unit operates together with the first AGC unit such that the strength of the input signal is attenuated at a time, the second reference value being greater than the first reference value.

8. The vehicle antenna as set forth in claim 7, wherein the first AGC unit includes an Operational Amplifier (OPAMP) which is used as an amplifier such that if the strength of the input signal, which is equal to or greater than the first reference value, increases, gain of the OPAMP increases, high voltage is output, and thereby the attenuation increases.

9. The vehicle antenna as set forth in claim 7, wherein the second AGC unit includes an OPAMP which is used as a switching-type comparator such that if the strength of the input signal is lower than the second reference value, the power is supplied to the transistor by being switched on and the transistor performs an amplification function, and if not, the power is not supplied to the transistor by being switched off and the transistor performs an attenuation function.

10. The vehicle antenna as set forth in claim 7, wherein the transistor is coupled to a transformer.

11. The vehicle antenna as set forth in claim 7, wherein the first AGC unit comprises a Positive-Intrinsic-Negative (PIN) diode.

12. The vehicle antenna as set forth in claim 7, wherein, the second AGC unit includes a coupled capacitor, a Schottky Diode and a switching-type Schmidt trigger comparator.

* * * * *